(12) United States Patent
Becknell et al.

(10) Patent No.: US 7,449,416 B2
(45) Date of Patent: Nov. 11, 2008

(54) APPARATUS AND PLASMA ASHING PROCESS FOR INCREASING PHOTORESIST REMOVAL RATE

(75) Inventors: Alan F. Becknell, Ellicott City, MD (US); Philip Hammar, Chevy Chase, MD (US); David Ferris, Rockville, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 229 days.

(21) Appl. No.: 11/217,247

(22) Filed: Sep. 1, 2005

(65) Prior Publication Data

US 2006/0046470 A1 Mar. 2, 2006

Related U.S. Application Data

(60) Provisional application No. 60/606,360, filed on Sep. 1, 2004.

(51) Int. Cl.
*H01L 21/302* (2006.01)
(52) U.S. Cl. ........................ 438/725; 438/710
(58) Field of Classification Search ............... 438/637, 438/706, 707, 710, 725, 731; 156/345.33–345.36
See application file for complete search history.

(56) References Cited

U.S. PATENT DOCUMENTS

| | | | |
|---|---|---|---|
| 4,341,592 A | 7/1982 | Shortes et al. | 156/643 |
| 5,364,488 A * | 11/1994 | Minato et al. | 156/345.27 |
| 5,498,308 A | 3/1996 | Kamarehi et al. | 156/345 |
| 5,961,851 A | 10/1999 | Kamarehi et al. | 216/69 |
| 5,968,275 A | 10/1999 | Lee et al. | 118/723 R |
| 5,980,638 A | 11/1999 | Janos | 118/715 |
| 6,057,645 A | 5/2000 | Srivastava et al. | 315/111.21 |

(Continued)

FOREIGN PATENT DOCUMENTS

EP 1 150 330 A2 10/2001

(Continued)

OTHER PUBLICATIONS

D. Shamiryan et al., "Low-k Dielectric Materials", Materials Today, Jan. 2004.,pp. 34-39.

(Continued)

*Primary Examiner*—Kevin M Picardat
(74) *Attorney, Agent, or Firm*—Cantor Colburn LLP

(57) ABSTRACT

A plasma ashing process for removing photoresist material and post etch residues from a substrate comprising carbon, hydrogen, or a combination of carbon and hydrogen, wherein the substrate comprises a low k dielectric layer, the process comprising forming a plasma from an essentially oxygen free and nitrogen free gas mixture; introducing the plasma into a process chamber, wherein the process chamber comprises a baffle plate assembly in fluid communication with the plasma; flowing the plasma through the baffle plate assembly and removing photoresist material, post etch residues, and volatile byproducts from the substrate; periodically cleaning the process chamber by introducing an oxygen plasma into the process chamber; and cooling the baffle plate assembly by flowing a cooling gas over the baffle plate assembly. A process chamber adapted for receiving downstream plasma, the process chamber comprising an upper baffle plate comprising at least one thermally conductive standoff in thermal communication with a wall of the process chamber; and a lower baffle plate spaced apart from the upper baffle plate.

22 Claims, 6 Drawing Sheets

U.S. PATENT DOCUMENTS

| | | | |
|---|---|---|---|
| 6,225,745 B1 | 5/2001 | Srivastava | 315/111.51 |
| 6,281,135 B1 | 8/2001 | Han et al. | 438/725 |
| 6,415,736 B1 | 7/2002 | Hao et al. | 118/723 E |
| 6,630,406 B2 | 10/2003 | Waldfried et al. | 438/710 |
| 2004/0026386 A1 | 2/2004 | Hogan et al. | 219/121.36 |
| 2004/0026783 A1 | 2/2004 | Kloster et al. | 257/758 |
| 2004/0084412 A1 | 5/2004 | Waldfried et al. | 216/67 |
| 2004/0235299 A1* | 11/2004 | Srivastava et al. | 438/689 |
| 2005/0150601 A1* | 7/2005 | Srivastava | 156/345.33 |
| 2005/0241669 A1* | 11/2005 | Wodecki | 134/1.1 |

FOREIGN PATENT DOCUMENTS

| | | |
|---|---|---|
| WO | WO 97/37055 | 10/1997 |

OTHER PUBLICATIONS

J. Golden et al., "Designing Porous Low-k Dielectrics", http://www.microbar.com/news/articles/articles/design LOWkdielectric/porus.htn.

J.T. Rantala et al., "The case for nonporous low-k dielectrics" Solid State Technology, Dec. 2003.

K. Buchanan et al., "Challenges associated with the integration of nanp-porous ultra low k CVD films.", SEMICON West 2002, SEMI Technical Symposium (STS): Innovations in Semiconductor Manufacturing.

* cited by examiner

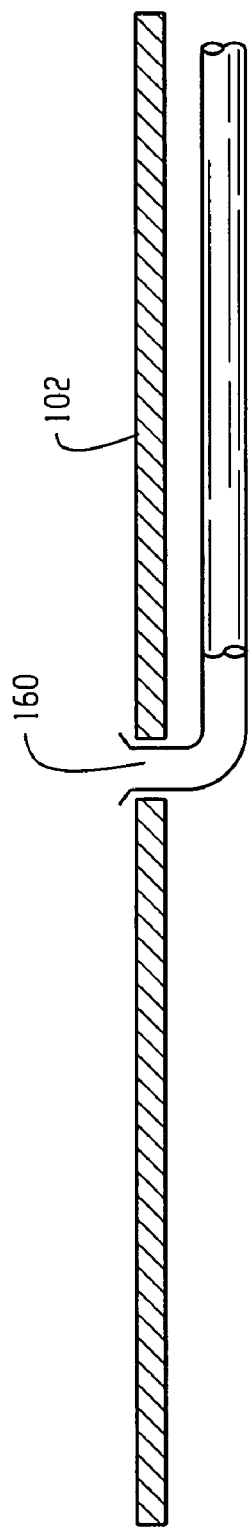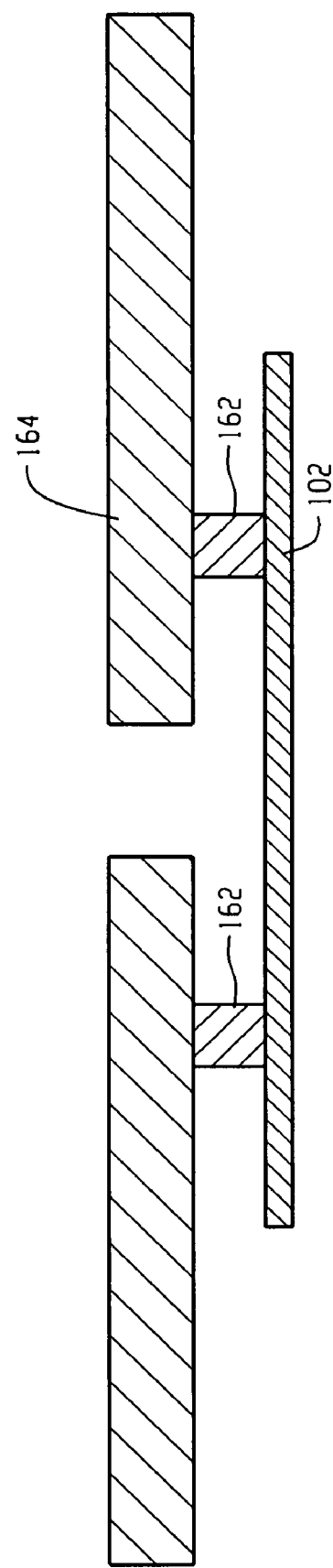

APPARATUS AND PLASMA ASHING PROCESS FOR INCREASING PHOTORESIST REMOVAL RATE

CROSS REFERENCE TO RELATED APPLICATIONS

The present application relates to and claims priority to U.S. Provisional Application No. 60/606,360, filed on Sep. 1, 2004, incorporated herein by reference in its entirety.

BACKGROUND

The present disclosure relates to semiconductor manufacturing, and more particularly, to plasma ashing processes for removing photoresist and post etch residues from a substrate.

Recently, much attention has been focused on developing low k dielectric thin films for use in the next generation of microelectronics. As integrated devices become smaller, the RC-delay time of signal propagation along interconnects becomes one of the dominant factors limiting overall chip speed. With the advent of copper technology, R (resistance) has been pushed to its practical lowest limit. As such, attention is focused on reducing C (capacitance) in order to increase overall chip speed. One way of accomplishing this task is to reduce the dielectric constant (often referred to as "k") of the thin insulating films surrounding interconnects, thereby reducing C and improving overall chip speed.

Traditionally, silicon dioxide ($SiO_2$) has been employed as an insulating film material. The terms low k and high k as used herein are relative to the dielectric constant (k) of silicon dioxide ($SiO_2$), i.e., a low k material generally refers to a material having a dielectric constant less than that of silicon dioxide (e.g., less than about 3.9) and a high k material generally refers to a material having a dielectric constant greater than that of silicon dioxide (e.g., greater than about 3.9). Low k materials generally include, but are not limited to, organic polymers, amorphous fluorinated carbons, nanofoams, silicon based insulators comprising organic polymers, carbon doped oxides of silicon, fluorine doped oxides of silicon, and the like.

In fabricating integrated circuits on substrates (e.g., wafers), the substrates are generally subjected to many process steps before finished integrated circuits can be produced. Low k dielectric materials, especially carbon containing low k dielectric materials, can be sensitive to some of these process steps. For example, plasma used during an "ashing" step can strip both photoresist materials and remove a portion of the carbon containing low k dielectric film. Ashing generally refers to a plasma mediated stripping process by which residual photoresist and post etch residues are stripped or removed from a substrate upon exposure to the plasma. The ashing process generally occurs after an etching or implant process has been performed in which a photoresist material is used as a mask for etching a pattern into the underlying substrate or for selectively implanting ions into the exposed areas of the substrate. The ashing step is typically followed by a wet chemical treatment to remove traces of the etch residues. However, the wet chemical treatment can cause further degradation of the low k dielectric, loss of material, and can also cause an increase in the dielectric constant.

It is important to note that ashing processes significantly differ from etching processes. Although both processes can be plasma mediated, an etching process is markedly different in that the plasma chemistry is chosen to permanently transfer an image into the substrate by removing portions of the substrate surface through openings in a photoresist mask. The plasma generally includes high-energy ion bombardment at low temperatures (e.g., about room temperature (about 21° C.) to about 140° C.) and low pressures (of the order of millitorr) to remove portions of the substrate. Moreover, the portions of the substrate exposed to the ions are generally removed at a rate equal to or greater than the removal rate of the photoresist mask.

In contrast to etching processes, ashing processes generally refer to selectively removing the photoresist mask and any polymers or residues formed during etching. The ashing plasma chemistry is much less aggressive than etching chemistries and is generally chosen to remove the photoresist mask layer at a rate much greater than the removal rate of the underlying substrate. Moreover, most ashing processes heat the substrate to temperatures greater than 200° C. to increase the plasma reactivity, and are performed at relatively higher pressures (of the order of a torr). Thus, etching and ashing processes are directed to removal of significantly different materials and as such, employ completely different plasma chemistries and processes. Successful ashing processes are not used to permanently transfer an image into the substrate. Rather, successful ashing processes are defined by the photoresist, polymer, and residue removal rates without affecting or removing underlying layers, e.g., low k dielectric layers.

Studies have suggested that a significant contribution to low k dielectric degradation during photoresist removal processes results from the use of oxygen, nitrogen, and/or fluorine containing gas sources for generating ashing plasmas. Although gas mixtures comprising these sources efficiently ash photoresist from the substrate, the use of these gas sources has proven detrimental to substrates containing low k dielectrics. For example, oxygen-containing plasmas can raise the dielectric constant of low k dielectric underlayers during plasma processing. The increases in dielectric constant affects, among others things, interconnect capacitance, which directly impacts device performance. Moreover, the use of oxygen-containing plasmas is generally less preferred for advanced device fabrication employing copper metal layers, since copper metal is readily oxidized.

Ideally, the ashing plasma should not affect the underlying low k dielectric layers and should preferentially remove only the photoresist material. The use of traditional dielectrics such as $SiO_2$ provided high selectivity with these gas sources (e.g., oxygen, nitrogen, and/or fluorine containing gas sources) and was suitable for earlier device generation. An issue with low k dielectrics is their sensitivity to attack by oxidative plasma species. In order to minimize damage to the low k dielectric, essentially oxygen free (e.g., comprising less than about 20 parts per million (ppm) oxygen ($O_2$)) and essentially nitrogen free (e.g., comprising less than about 20 ppm nitrogen ($N_2$)) plasma processes have been developed. One such process is described in U.S. Pat. No. 6,630,406 to Waldfried et al., wherein the process includes generating plasma from a gas mixture comprising a noble gas (e.g., helium) and hydrogen. The oxygen free and nitrogen free plasma, such as the above noted plasma formed from helium and hydrogen, is less aggressive and does not completely react with the photoresist in the traditional sense. Rather, it is believed that the plasma renders portions of the photoresist to be removable such as by sublimation and volatilization. As a result, while essentially oxygen and nitrogen free plasmas are effective for removing photoresist material from the substrate, the plasma exposure tends to deposit large bodies of the sublimed (or volatized) or removed photoresist and byproducts within the processing chamber and in areas downstream from the plasma process chamber such as in the exhaust lines and any components therein. As a result, periodic cleaning of the process chamber is required, which generally requires the use of oxidizing plasma. The oxidizing plasma can provide a means for in situ cleaning of the chamber. However, the oxidizing plasma has been found to cause the baffle plate assembly (commonly employed in the process chamber to uniformly distribute the ashing plasma to the substrate) to increase in temperature, especially at the impingement center where the plasma first impacts the baffle plate assembly. The increase in temperature during subsequent wafer processing has been found to decrease the ashing rate and negatively impact the uniformity of the ashing process across the wafer surface, particularly the removal rate difference between the center and edge of the wafer.

An additional problem with oxygen free and nitrogen free plasmas is the non-uniformity of the plasma exposure. Since these plasmas are less aggressive, non-uniformity is a significant issue. Some downstream plasma ashers have a narrow diameter orifice plasma tube in which the plasma is generated. The diameter of the substrate is generally much larger than the diameter of the plasma tube orifice. As such, a baffle plate(s) is typically positioned near the plasma tube outlet to deflect the plasma as it enters the process chamber such that the species in the plasma are uniformly dispersed across the substrate. The temperature of the baffle plate assembly can undesirably vary during normal machine operation depending on the duration of plasma exposure per wafer, the number of wafers processed in a batch and the length of time between batches. As a result, the ashing rate and uniformity can be affected in substantially the same way (although to a lesser extent) as was described previously for the oxidizing plasma cleaning process.

Accordingly, there is a need in the art for a process for reducing the temperature at the impingement portion i.e., center portion, of the baffle plate, while maintaining or enhancing the photoresist removal rate.

BRIEF SUMMARY

Disclosed herein are plasma ashing processes for removing photoresist, post etch residues and volatile byproducts from a substrate. In one embodiment, the plasma ashing process for removing photoresist material and post etch residues from a substrate comprising carbon, hydrogen, or a combination of carbon and hydrogen, wherein the substrate comprises a low k dielectric material comprises forming a plasma from an essentially oxygen free and nitrogen free gas mixture; flowing the plasma through a baffle plate assembly and onto the substrate and removing photoresist material, post etch residues, and volatile byproducts from the substrate; flowing a cooling gas through an baffle plate assembly in a direction counter to the plasma flow and in an amount effective to reduce a temperature of the upper baffle plate.

In another embodiment, a plasma ashing process for removing photoresist material and post etch residues from a substrate comprising carbon, hydrogen, or a combination of carbon and hydrogen, wherein the substrate comprises a low k dielectric layer comprises forming a plasma from an essentially oxygen free and nitrogen free gas mixture, wherein the plasma comprises hydrogen and helium; flowing the plasma into a process chamber, wherein the process chamber comprises a baffle plate assembly in fluid communication with the plasma, wherein the baffle plate assembly comprises a generally planar upper baffle plate fixedly positioned above a generally planar lower baffle plate, the lower baffle plate comprising a plurality of apertures disposed about a central axis, wherein the plurality of apertures increase in density from the central axis to an outer edge of the lower baffle plate; periodically cleaning the process chamber by introducing an oxygen plasma into the process chamber; and cooling the baffle plate assembly by flowing a cooling gas at and about a central impingement region of the upper baffle plate In another embodiment, a process chamber adapted for receiving plasma, comprises a baffle plate assembly comprising a generally planar upper baffle plate positioned above a generally planar lower baffle plate, the lower baffle plate, the upper baffle plate comprising at least one thermally conductive standoff in thermal communication with a wall of the process chamber The above-described and other features will be appreciated and understood by those skilled in the art from the following detailed description, drawings, and appended claims.

BRIEF DESCRIPTION OF THE DRAWINGS

Referring to the exemplary drawings wherein like elements are numbered alike in the several Figures:

FIG. 7 is a sectional view of an upper baffle plate having a separate gas conduit for cooling the central portion of the baffle plate;

FIG. 8 is a sectional view of an upper baffle plate attached to the chamber lid using thermally conductive standoffs.

DETAILED DESCRIPTION

Figure 1:
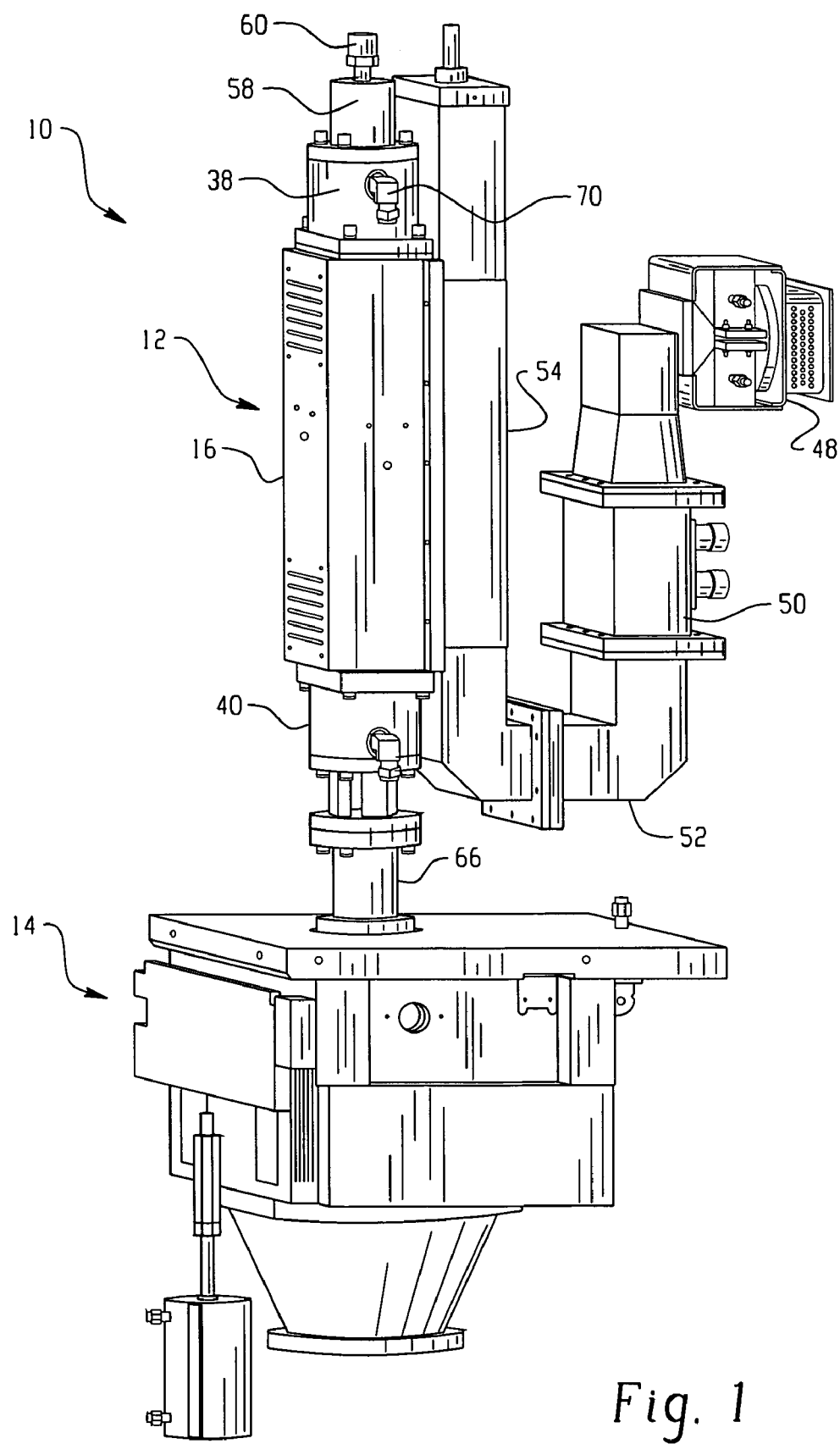
FIG. 1 is a perspective view of an exemplary plasma ashing apparatus.

A plasma ashing process employing oxygen free and nitrogen free plasmas for use with low k insulating materials is disclosed, wherein the ashing apparatus comprises a novel baffle assembly for uniformly distributing the ashing plasma. In addition, processes for cooling an impingement point of the baffle assembly and preferred hardware configurations for said cooling are disclosed. While the process is described in relation to low k materials and an exemplary plasma asher apparatus, it is to be understood that the process and baffle assemblies can be readily adapted for higher k insulating materials and varying plasma asher apparatus designs.

The terms "oxygen free" and "nitrogen free" are used throughout this disclosure to refer to a plasma comprising less than about 20 parts per million (ppm) of the given oxygen or nitrogen component, with less than about 5 ppm more preferred, and with less than about 100 parts per billion (ppb) most preferred. It will be understood by those skilled in the art that for a given application the optimal level will be a compromise between the ashing rate, which can sometimes benefit from higher levels of oxygen and/or nitrogen, and the preservation of the low k properties of the dielectric layer, which generally benefit from lower levels of oxygen and/or nitrogen. The term "low k" refers to materials having a dielectric constant less than that of silicon dioxide, which has a dielectric constant of about 3.9. For example, low k materials can have a dielectric constant less than about 3.5, with about 1.5 to about 3.0 preferred. Low k dielectrics for which the present disclosure is intended includes, but is not limited to, carbon containing dielectrics, hydrogen containing dielectrics, fluorine doped oxides of silicon, silicon based dielectrics comprising organic polymers, and the like.

As used herein, carbon containing low k dielectrics are those carbon containing insulating materials suitable for use in the manufacture of integrated circuits or the like comprising a dielectric constant less than about 3.9, and more preferably less than 3.5. The carbon-containing low k dielectric materials can include pendant groups that comprise carbon or can be carbon based wherein the backbone of the dielectric material is primarily comprised of an interconnecting network of carbon. Carbon containing low k dielectrics can generally be categorized as one of two types: organic and doped oxides. Examples of organic low k dielectric materials include polyimides, benzocyclobutene, parylenes, diamond-like carbon, poly(arylene ethers), cyclotenes, fluorocarbons and the like, such as those dielectrics commercially available under the trademarks SiLK, or BCB. Examples of doped oxide low k dielectric materials include methyl silsesquioxane, hydrogen silsesquioxanes, nanoporous oxides, carbon doped silicon dioxides, and the like, such as, for example, those dielectrics commercially available under the trademarks CORAL, BLACK DIAMOND and AURORA. Both types of carbon containing low-k materials are available in dense and porous versions. Porous versions thereof are commercially available under trademarks such as LKD, ORION, BOSS, or porous SiLK.

Likewise, hydrogen containing low k dielectrics are those hydrogen containing insulating materials suitable for use in the manufacture of integrated circuits or the like comprising a dielectric constant less than about 3.9, and more preferably less than about 3.5. Many of the carbon containing low k dielectrics described above include a hydrogen atom(s) attached to the carbon atoms within its chemical structure. As such, suitable hydrogen containing low k dielectric materials in the present disclosure are not intended to exclude carbon-containing structures and vice versa.

The particular components of the plasma gas mixture are selected by their ability to form a gas and plasma under plasma forming conditions. The gas mixture is essentially free from components that generate reactive oxygen species and reactive nitrogen species under plasma forming conditions. More preferably, the gas mixture is essentially free from oxygen-containing compounds and nitrogen-containing compounds. The gas mixture can include a number of reactive gases that are hydrogen-bearing such as hydrogen and hydrocarbons. The gas mixture can further comprise an inert noble such as argon, helium, neon, and the like. The plasma generated from the gas mixture primarily reacts with carbon and other atoms in the photoresist, polymers, and residues to form compounds that are volatile under the temperature and pressure conditions of the substrate and/or rinse removable compounds. Hydrogen-bearing gases suitable for use in the process include those compounds that contain hydrogen. The hydrogen-bearing gases include hydrocarbons, hydrogen gas, or mixtures thereof. Preferably, hydrogen-bearing gases exist in a gaseous state under plasma forming conditions and release hydrogen to form reactive hydrogen such as atomic hydrogen species and other hydrogen radicals under plasma forming conditions. The hydrocarbons are generally unsubstituted. Examples of hydrogen-bearing hydrocarbon gases include methane, ethane, and propane.

In an exemplary embodiment, hydrogen-bearing gases are mixtures of a hydrogen-bearing gas and a noble gas. Examples of noble gases suitable for use in the process include a gas in Group VIII of the periodic table such as argon, neon, helium and the like. Although prior art oxygen-free plasmas generally use a forming gas composition that comprises a hydrogen and nitrogen gas mixture, the use of nitrogen gas in the disclosed process is expressly excluded. Preferably, the gas mixture comprises hydrogen and helium gases. Helium gas atoms are light and readily diffuse to the substrate, which results in excellent carrier characteristics for plasma generated reactive hydrogen species.

For safety reasons, the percentage of hydrogen gas in the gas mixture generally does not exceed about 5 percent by volume (vol. %) of the gas mixture. However, higher amounts of hydrogen are acceptable and sometimes preferred for increasing the photoresist removal rate and selectivity. Preferably, the amount of hydrogen in the gas mixture is about 1 vol. % to about 99 vol. % percent, wherein volume percents are based on a total volume of the gas mixture. More preferably, the amount of hydrogen in the gas mixture is from about 10 vol. % to about 30 vol. %.

The process can be practiced in plasma ashers that include a plasma source and a processing chamber. As briefly noted above, the disclosure is not intended to be limited to any particular plasma asher. Plasma ashers particularly suitable for practicing the present disclosure are downstream plasma ashers, such as, for example, those microwave plasma ashers available under the trade name Axcelis RadiantStrip 320Lk®, which are commercially available from Axcelis Technologies, Inc. in Beverly, Mass. Portions of the microwave plasma asher are described in U.S. Pat. Nos. 5,571,439, 5,498,308, 6,082,374, 5,980,638, 5,961,851, 6,057,645, 6,225,745 and 4,341,592, and PCT International Application No. WO/97/37055, all of which are incorporated herein by reference in their entireties. Other examples of plasma generating and discharge apparatus that can be utilized according to the present disclosure include ashers employing radio frequency (RF) energy to generate the plasma.

Referring now to FIG. 1, an exemplary plasma ashing apparatus generally designated 10 is illustrated. The plasma ashing apparatus 10 generally comprises a microwave plasma-generating component 12 and a process chamber 14. The microwave plasma-generating component 12 includes a microwave enclosure 16. Generally, the microwave enclosure 16 is a rectangular box that is partitioned into lengthwise sections having a plasma tube passing therethrough. Each section is fed with microwave energy during operation. As such, each section appears to be a relatively short cavity to the incoming microwave energy, promoting the formation of modes having azithumal and axial uniformity. Preferably, the microwave enclosure 16 is dimensioned to support a rectangular TM 110 mode and the microwave enclosure 16 can have a square cross section. The dimensions of the cross sections are such that the TM 110 mode is resonant. The length of each section is less than $\lambda_g/2$ where $\lambda_g$ is the guide length within the cavity of a TE 101 mode.

Microwave traps 38 and 40 are provided at the ends of the microwave plasma-generating component 12 to prevent microwave transmission. Such traps can be of the type disclosed in U.S. Pat. No. 5,498,308.

Magnetron 48 provides microwave power that is fed through coupler 50 to a waveguide supplying the TE 101 mode, having mutually perpendicular sections 52 and 54. The length of waveguide section 54 is adjustable. A plate of waveguide section 54 couples microwave energy into the partitioned microwave structure 16, through which the plasma tube extends; thus plasma can be excited in a gas mixture flowing through the plasma tube.

Referring again to FIG. 1, end cap 58 is in physical communication with microwave trap 38 and fitting 60. A gas inlet 70 is in fluid communication with the plasma tube that is supported at this end by an O-ring in the end cap 58. The other end of the plasma tube is located in end member 66, and has an opening for emitting plasma/gas into the process chamber 14. Optionally, the conduit forming the opening is fitted with a narrow aperture fitting to create a pressure differential between the plasma tube and the processing chamber 14, wherein the pressure is greater in the plasma tube. During operation, the pressure within the plasma tube preferably is about 1 torr to about atmospheric pressure (about 760 torr). In contrast, the pressure within the process chamber 14 during operation is about 100 millitorr to about atmospheric pressure (760 torr).

The opening of the plasma tube is in fluid communication with an interior region of the process chamber 14. Since the plasma is discharged from a relatively narrow orifice (compared to the dimensions of the substrate to be processed) into the interior of the process chamber 14, a gas distribution system 100 (see FIG. 2) to promote uniform plasma exposure onto the substrate is disposed within the process chamber 14. The gas distribution system 100 is disposed intermediate to the substrate and opening of the plasma tube.

In an exemplary embodiment, the gas distribution system 100 comprises a baffle plate(s) positioned above and coaxial to the substrate to promote even distribution of the plasma to the substrate surface. The baffle plate(s) is preferably comprised of multiply stacked baffle plates, wherein each plate comprises a plurality of apertures. By way of example, FIGS. 2 through 5 illustrate suitable gas distribution systems for use in the apparatus 10. In the illustrated embodiments, the gas distribution system 100 is shown as a dual baffle plate assembly. However, one of ordinary skill in the art will understand that additional baffle plates can be employed that incorporate the teachings provided herein and merely optimizes the gas distribution system. As such, the present disclosure is not intended to be limited to a dual baffle plate configuration.

FIG. 1 shows the process chamber 14 into which is incorporated an embodiment of the gas distribution system (baffle plate assembly) 100. The asher process chamber 14 comprising the gas distribution system 100 of FIGS. 2-5 installed therein is suitable for use in a 300 millimeter (mm) substrate (wafer) processing system. The gas distribution system 100 could also be adapted for use with 200 mm wafers, as would be appreciated by one of ordinary skill in the art in view of this disclosure. Moreover, although the gas distribution system 100 described herein is shown as being implemented within a downstream plasma asher apparatus, it can also be used in other semiconductor manufacturing equipment, such as residue removal, stripping, and isotropic etching equipment.

Figure 2:
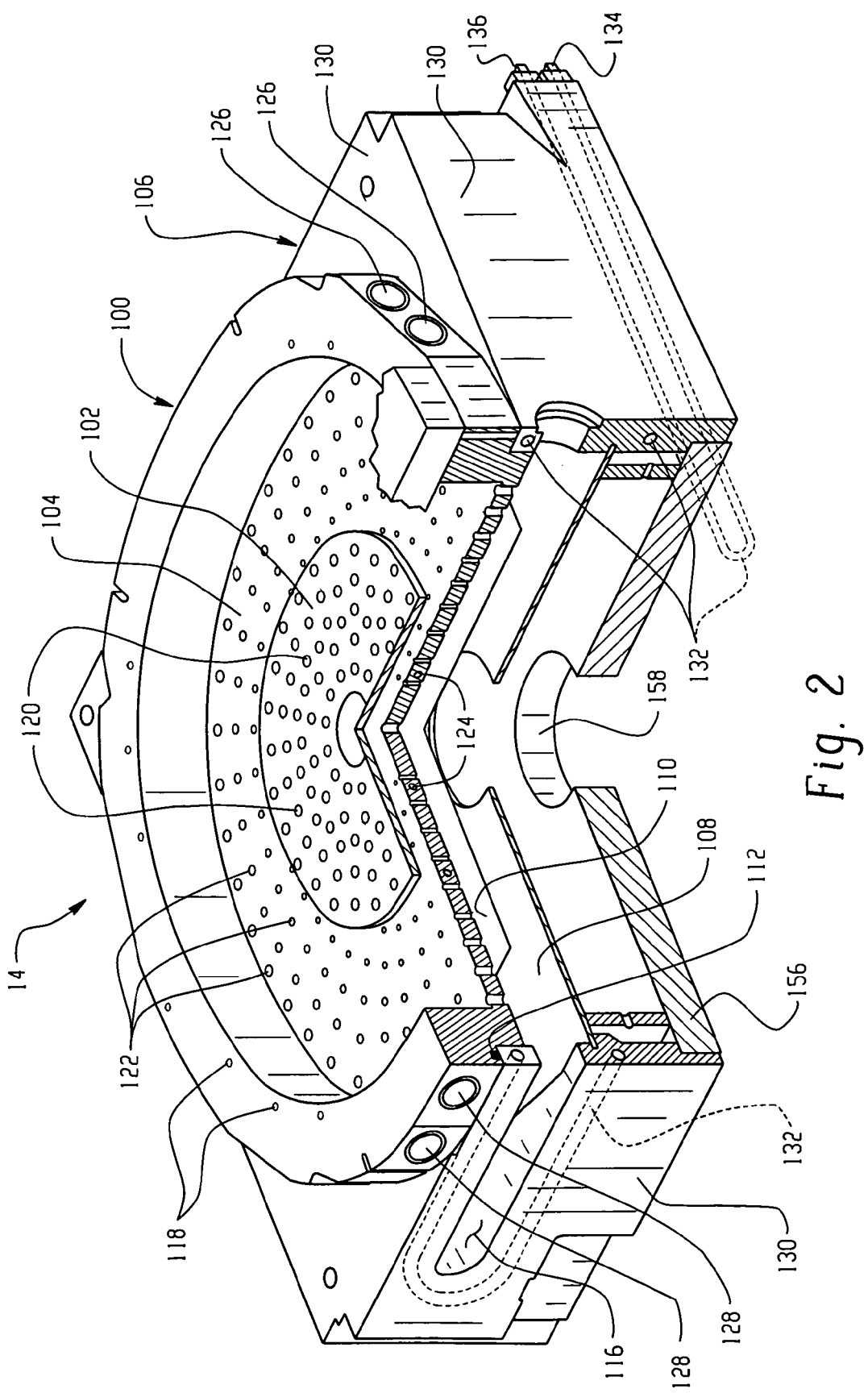
FIG. 2 is a partial cutaway perspective view of a photoresist asher process chamber into which is installed a gas distribution system.
Figure 3:
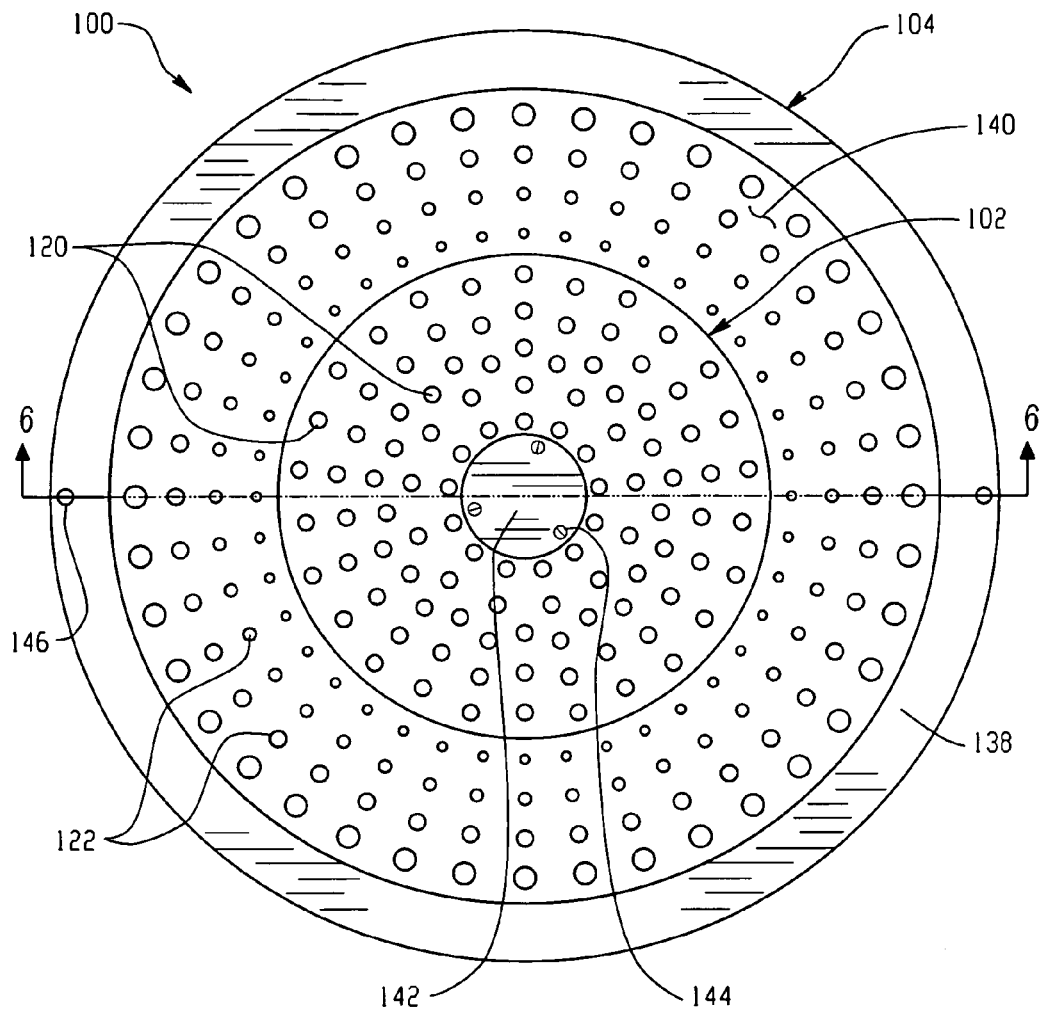
FIG. 3 is a plan view of the gas distribution system in accordance with one embodiment.
Figure 4:
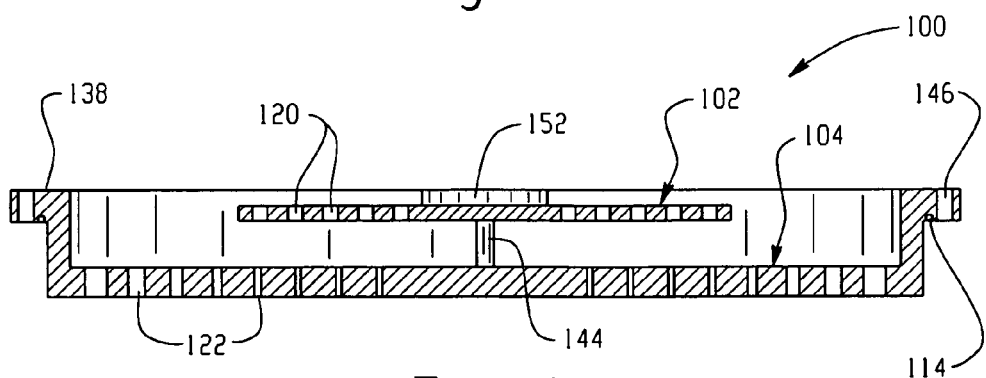
FIG. 4 is a sectional view of the baffle plate assembly of FIG. 3 taken along lines 4-4.

Referring now to FIGS. 2-4, the gas distribution system 100 comprises an upper apertured baffle plate 102 and a relatively larger apertured lower baffle plate 104 positioned generally parallel to each other and separated from one another (e.g., have a space therebetween). As shown more clearly in FIG. 2, the gas distribution system 100 is in physical communication with a lower portion 106 of the process chamber 14 that includes a cavity 108 in which a substrate (wafer 110) to be processed is placed. The baffle plates 102 and 104, in addition to being oriented parallel to each other, are also oriented parallel to the wafer 110 being processed.

A seal 112 is provided at the interface between the gas distribution system 100 and the lower portion 106 of the process chamber 14, and resides within groove 114 in the lower baffle plate 104 (see FIGS. 2 and 4). Wafers are introduced into and removed from the process chamber via a load lock mechanism (not shown) via entry/exit passageway 116. A heater assembly (not shown), located under the lower portion 106 of the process chamber, heats the underside of the wafer 110 during processing to a desired temperature.

The process chamber 14 is generally installed within the plasma ashing apparatus 10 intermediate to the heater assembly (not shown) and plasma-generating component 12 at the locations of holes 118. During operation, energized plasma (gas) leaving the relatively narrow orifice of the plasma tube encounters the gas distribution system 100. For example, the energized plasma flowing from the plasma tube can first encounter a central area (e.g., an impingement point) of upper baffle plate 102 that is substantially free of apertures. This central area can divert energized gases emanating from the plasma tube and accelerating the gas/plasma species in a radial direction in order to achieve proper operation of the plenum formed between the lower baffle plate 104 and a lid of the process chamber 14. The plasma is then distributed into the process chamber cavity 108 via apertures 120 in the upper baffle plate 102 and apertures 122 in the lower baffle plate 104. In one embodiment, the lower baffle plate 104 can be actively cooled with a cooling medium flowing through internal cooling passages 124 via inlets 126 and outlets 128. The walls 130 of the lower portion 106 of the process chamber 14 can also be actively cooled with a cooling medium flowing through internal cooling passages 132 via inlet 134 and outlet 136.

The lower baffle plate 104, as shown more clearly in FIGS. 3 and 4, comprises an outer flange 138 and a generally planar portion 140 comprising apertures 122. Mounting holes (not shown) can be provided in the lower baffle plate 104 for mounting the upper baffle plate 102 thereto by means of standoffs 142. The distance between the upper baffle plate 102 and lower baffle plate 104 in part determines the pattern of gas flow through the gas distribution system 100. For 200 mm or 300 mm plasma ashers, the distance between the upper and low baffle plates, 102, 104, respectively, is preferably about 0.25 inches (about 0.6 centimeters (cm)) to about 2.0 inches (about 5.1 cm), with a distance of about 0.5 (about 1.3 cm) to about 1.5 inches (about 3.8 cm) more preferred. For the 200 mm configuration, it should be noted that the aperture density of in the upper baffle plate could be reduced relative to the aperture density of the 300 mm configuration.

FIG. 3 is a plan view of the 300 mm gas distribution system 100 shown in FIG. 2, and FIG. 4 is a sectional view of this embodiment of the gas distribution system 100. As shown in these figures, the gas distribution system 100 is in physical communication with (e.g., mounted to) the upper portion 106 of the process chamber 14 via mounting holes 146 in the lower baffle plate flange 138. Apertures 122 are provided in the lower baffle plate 104. The surface area of apertured portion 122 is sufficient to cover the wafer 110 residing therebelow (see FIG. 2). In this embodiment, the size of the apertures 122 increases from a central region of the lower baffle plate 104 to an outer edge. The increasing size of the apertures 122 in the lower plate has been found to improve plasma uniformity for oxygen free and nitrogen free plasmas such as for use with carbon containing and/or hydrogen containing low k dielectrics. In contrast, the size of the apertures in the upper plate is constant and further includes a central impingement region free of apertures.

For the lower baffle plate, the diameter of the apertures is about 0.05 inches to about 0.25 inches. In another embodiment, the diameter is about 0.075 inches to about 0.175 inches. For the upper baffle plate, the aperture diameter is about 0.1 inch to about 0.5 inch. In another embodiment, the aperture diameter is about 0.2 inch to about 0.3 inch.

By way of example, an upper and lower baffle plate configuration suitable for use in the present disclosure is as follows. The upper baffle plate is 4 inches in diameter and the lower baffle plate is 7.5 inches in diameter, wherein the upper and lower baffle plates are spaced apart by 1.0 inch. The apertures of the lower baffle plate increases radially from the center of about 0.09 inch diameter to a 4 inch radius and about 0.15 inch diameter to a 7.5 inch radius, i.e., the edge of the lower baffle plate. In this exemplary lower baffle plate configuration, the lower baffle plate would have apertures at the center most region of the plate. The upper baffle plate would have an apertureless central region out to a 1-inch radius, and an aperture diameter of 0.25 inch to a 4 inch radius, i.e., the edge of the plate.

Figure 5:
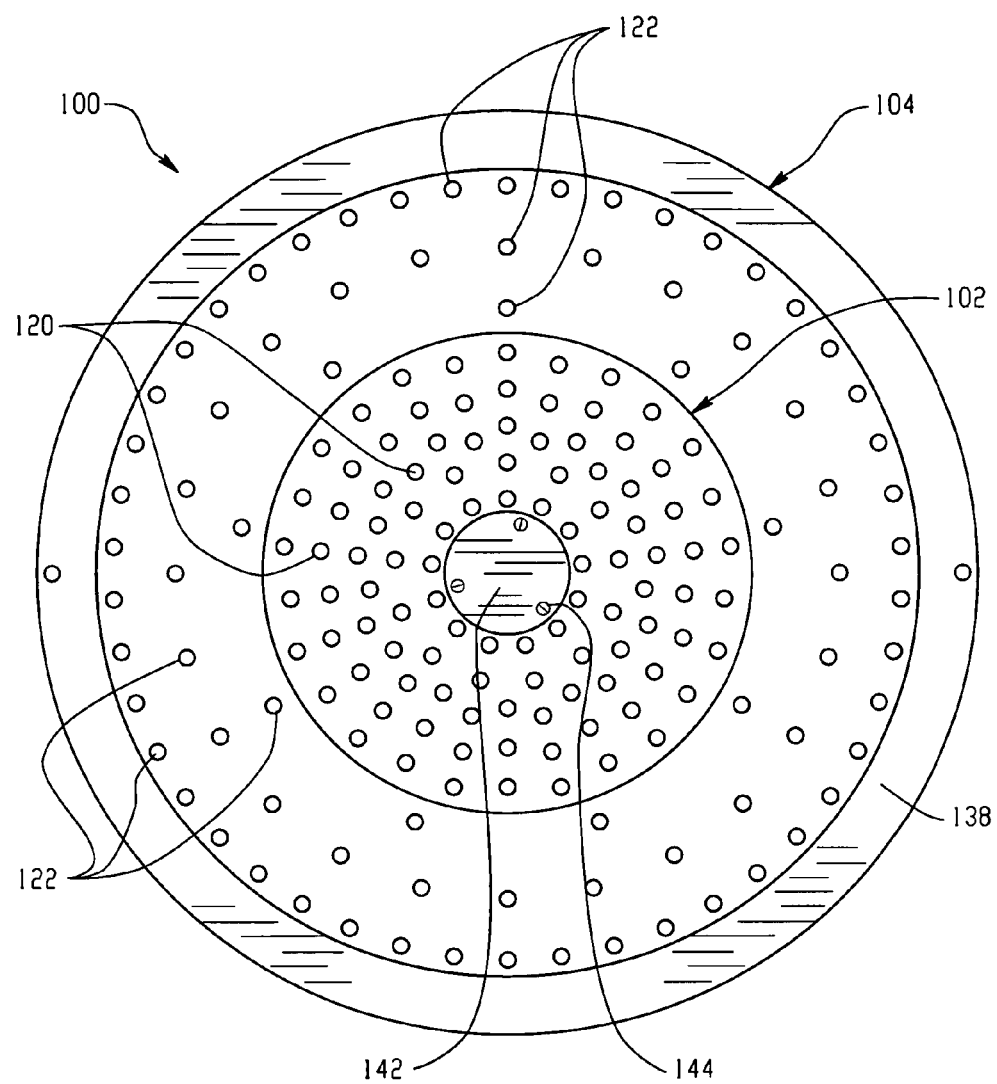
FIG. 5 is a plan view of the gas distribution system in accordance with another embodiment.

FIG. 5 illustrates a plan view of the lower baffle plate 104 in accordance with another embodiment. There, the density of the apertures 122 increases from the center point of the lower baffle plate 104 to the outer edge, wherein the sizes of the apertures are the same. The lower baffle plate in the various embodiments describe herein is preferably fabricated from quartz ($SiO_2$), sapphire coated quartz, sapphire, ceramic, or anodized aluminum.

The apertures 120 in the upper baffle plate 102 are generally arranged in a radial or concentric multiply circular pattern. The upper baffle plate 102 is comprised of sapphire-coated fused silica, quartz, sapphire, aluminum, or a ceramic material. The apertures 120 in the upper baffle plate 102 are preferably slightly larger than the largest apertures 122 in the lower baffle plate 104. Located at the center of the upper baffle plate 102 is preferably an area free of apertures that can additionally comprise a sapphire, quartz or ceramic impingement plate 144. The impingement plate 144 can be mounted to upper baffle plate 102 using any suitable means. For example, screw(s) 146 can be employed to mount the impingement plate 144 to upper baffle plate. The center portion of upper baffle plate 102 with or without the impingement plate 144 diverts energized gases emanating from the plasma tube 32 radially outward to the remaining apertured area of the upper baffle plate 102, so as to prevent the radially inward portion of the wafer 110 being processed from overheating, and thereby ashing at a proportionately higher rate than the rest of the wafer. In an alternative embodiment, the upper baffle plate 102 can be configured to be apertureless, preferably for processing 200 mm wafers.

Figure 6:
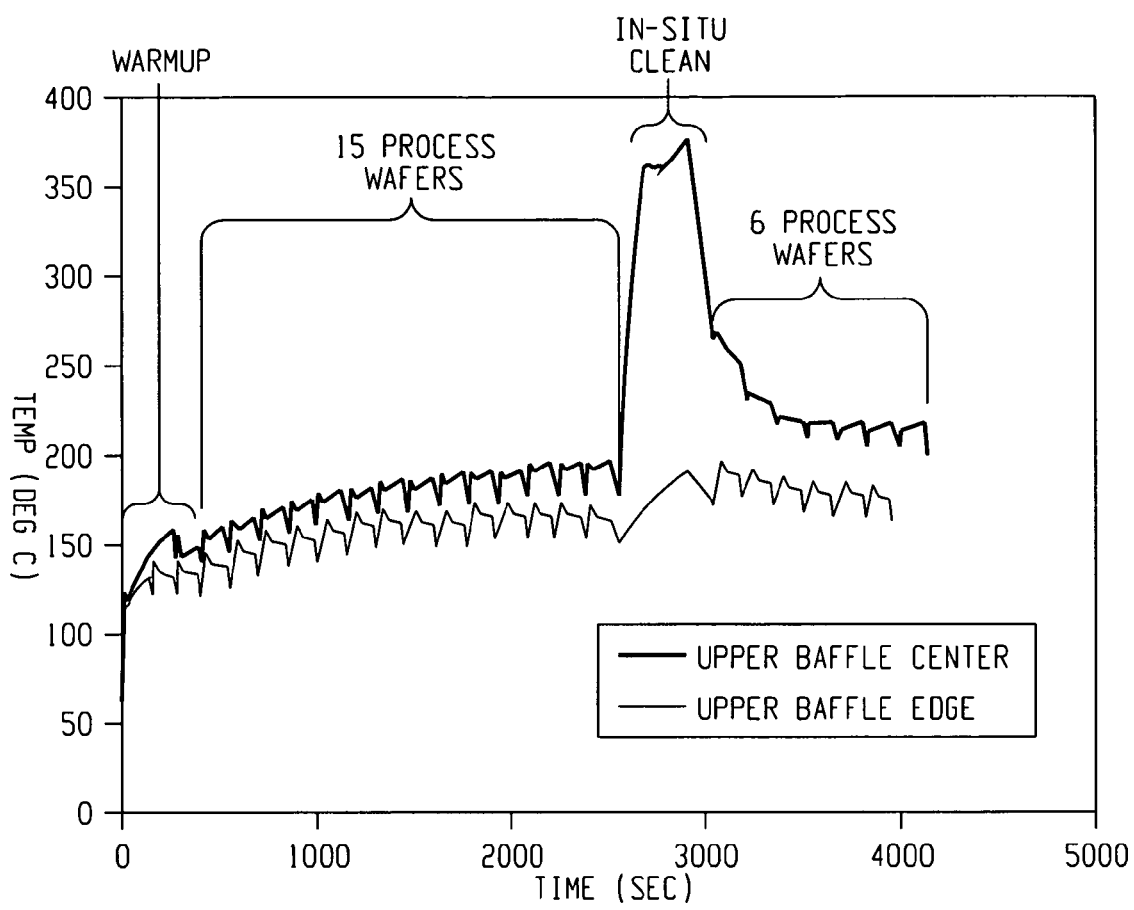
FIG. 6 is a graphical representation of baffle temperature during processing conditions.

As briefly mentioned above, the use of oxygen free and nitrogen free plasmas, such as the plasmas formed from helium and hydrogen, can deposit sublimed, volatilized, or removed photoresist and byproducts within the processing chamber 14 and in areas downstream from the plasma process chamber 14 such as in exhaust lines and any components therein. The process chamber 14 can be cleaned "in-situ" by periodically running an oxygen-containing plasma generated with high power through the system. However, this cleaning process can cause heating of the upper baffle plate 102 as illustrated in FIG. 6. It should be noted that FIG. 6 is provided merely for illustration and that one of ordinary skill in the art could readily vary, for example, the process time and number of wafers processed (wafer batch size) in an effort to control the baffle temperature.

In FIG. 6, baffle plate temperature as a function of time was measured for a microwave plasma asher including a process chamber having a dual baffle plate assembly. The upper baffle plate temperature was measured at about the plate center (impingement point of plasma as it enters the process chamber) and compared to the upper baffle plate temperature recorded at the plate edge. Fifteen wafers were sequentially exposed to an oxygen and nitrogen free plasma for about 2,250 total seconds, followed by an in-situ clean using an oxygen plasma for about 500 seconds, followed by processing 6 additional wafers with the oxygen and nitrogen free plasma. During processing of the first 15 wafers, the temperature at the center and edge of the upper baffle plate was at about 150° C. to about 200° C. However, during in-situ cleaning, the temperature at the center of the upper baffle increased to about 350° C. to about 400° C., resulting in a significant temperature increase at the center of the plate whereas the plate edge temperature did not change to any significant degree from the processing temperatures. The high power oxygen cleaning process, which is necessary to periodically clean the chamber, resulted in extreme heating of the upper baffle plate impingement center. Subsequent processing of an additional 6 wafers shows that the temperature at the plate center was at about 200 to 250° C. It has been found that the increase in temperature at the impingement point results in an increase in ashing non-uniformity (NU). Moreover, photoresist removal by the essentially oxygen and nitrogen free plasma decreased. Thus, while the essentially oxygen and nitrogen free plasma is preferred for ashing substrates containing low k materials, it can cause an increase in non-uniformity and a decrease in ashing rate as a result of the temperature non-uniformity of the upper baffle plate assembly.

To reduce the temperature non-uniformity caused by the in situ oxygen plasma clean process, it has unexpectedly been discovered that periodically flowing a gas (hereinafter "cooling gas") onto and/or through the center of the upper baffle plate during processing effectively reduces temperature non-uniformity. In one embodiment, the cooling gas flows through an underside of the upper baffle plate 102 via cooling gas conduit 160, which has an opening at the center of the upper baffle plate as shown using the configuration in FIG. 7. The cooling gas flows into the direction of the incoming plasma, which causes the cooling gas to deflect onto the impingement region to cool the central region of the upper baffle plate.

In another embodiment, the cooling gas can be directed to flow onto the impingement center of the upper baffle plate during a period of operation in which plasma is not ignited in the tube. For example, plasma is not ignited during wafer exchanges in and out of the process chamber 14 and during the beginning of a wafer process recipe, wherein the temperature of the substrate as well as the pressure within the process chamber 14 can be adjusted. While gas flow rates can vary depending on the application, an exemplary embodiment comprises a cooling gas flow rate of about 100 standard cubic centimeters per minute (sccm) to about 100 standard liters per minute (slm). Moreover, it is noted that one of skill in the art can readily adapt this disclosure for varying temperatures and pressures of the cooling gas.

Further, it is noted that the flow rate, temperature, pressure, type, and the like of the cooling gas can be selected to cool the center (impingement point) of the baffle, i.e., to decrease the temperature of the baffle to a temperature sufficient to maintain or increase photoresist removal rates. For example, the temperature at the impingement point of the baffle plate can decrease in an amount greater than or equal to 25° C., with about 25° C. to about 50° C. preferable. Exemplary cooling gases include, but are not intended to be limited to, inert gases such as argon, helium, and other gases and gas mixtures such as hydrogen and mixtures of helium and hydrogen.

Additionally, the time at the beginning of a wafer process recipe can optionally be increased to aid in cooling the baffle plate. Without the use of the cooling gas as disclosed herein, increasing the average plasma-on time in a recipe can cause the temperature at the impingement center of the baffle plate to increase leading to the problems previously described. For example, the photoresist removal rate decreases leading to a decrease in wafer throughput. Maintaining high photoresist removal rates advantageously increases wafer throughputs. Employing the cooling gas and optimizing the time at the beginning of the wafer process recipes can minimize the impact of the baffle heating that is caused by recipes with longer plasma-on times, for example. In one embodiment, the photoresist removal rate is increased by employing the cooling gas at the beginning of the wafer process recipe with a cooling gas time of 5 to 60 seconds being preferred and about 20 to 40 seconds being more preferred.

In another embodiment, a process for cooling a center point of a baffle that is employed in the asher apparatus comprises flowing a cooling gas through one or more mass flow controllers on the asher apparatus and optionally, overlapping the cooling time with the wafer heating step.

In another embodiment as shown in FIG. 8, the upper baffle plate 102 is made of a relatively thermally conductive material such as aluminum and is further attached to at least one heat sink body. For example, a suitable heat sink body is a water cooled lid 164 commonly found in process chambers, which can be coupled to the upper baffle plate with thermally conductive standoffs 162. The thermally conductive standoffs may be comprised of any thermally conductive material such as aluminum. Preferably, the upper baffle plate is constructed of a material having a generally higher thermal conductivity.

The disclosure is further illustrated by the following non-limiting examples.

EXAMPLE 1

Figure 9:
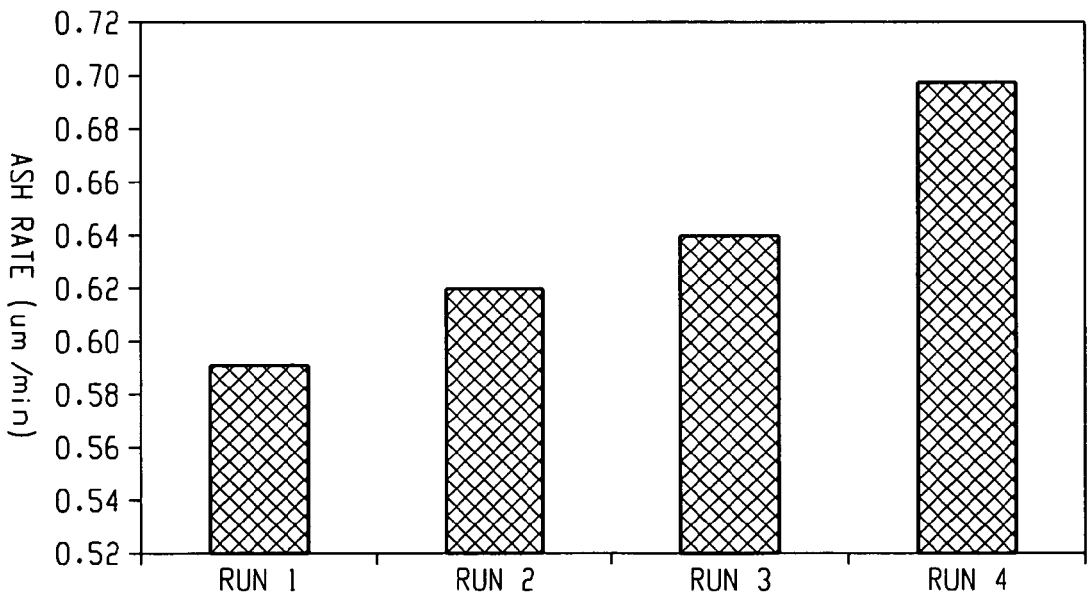
FIG. 9 is a graphical representation of ash rate as a function of baffle cooling.

In this Example, 4 sets of wafers having a layer of about 8,300 angstroms Shipley UV-6 photoresist thereon were exposed to an essentially oxygen and nitrogen free plasma ashing process using an ES3Lk plasma asher commercially available from Axcelis Technologies, Inc. The plasma asher included the dual baffle plate assembly as shown in FIGS. 2-4. Specifically, the plasma was formed from a gas mixture of hydrogen, helium, and a trace amount of oxygen at flow rates of 10,000 sccm (standard cubic centimeters per minute) of 4% hydrogen in helium and 100 µL/min (microliters per minute) of oxygen. Each wafer was processed under the same conditions, e.g., 300° C., 30 seconds plasma-on, 1 torr pressure, and 1,200 W power. Ashing rate and percent non-uniformity across the wafer were measured and averaged for each set using standard thickness measurements based on the photoresist Cauchy coefficients. The results are shown in FIG. 9.

Run 1 was a comparative example, wherein no cooling step was employed. Runs 2-4 employed a cooling step, wherein the 4% hydrogen in helium was employed at a cooling gas flow rate of 37 standard liters per minute. More particularly, "Run 2" employed a 15 second cooling purge during wafer heating; "Run 3" employed a 15 second cooling purge before wafer heating started; and "Run 4" employed a 30 second purge before wafer heating started.

The results clearly show that a significant decrease in ashing rate occurs without the use of the cooling gas. For example, Run 1 exhibited an ashing rate of about 0.59 µm/min (microns per minute of resist removal) but the addition of the cooling step increased the ash rate up to 0.62 µm/min for Run 2, 0.64 µm/min for Run 3, and 0.70 µm/min for Run 4.

Advantageously, the disclosed methods of cooling the impingement portion of the baffle plate allows for the ashing rate to be maintained and/or increased compared to apparatus designs and ashing processes that do not employ a cooling step. Moreover, in various embodiments the throughput of the asher apparatus is not affected because the increase in ash rate more than offsets the time needed for the cooling step.

EXAMPLE 2

In this example, a dual baffle plate assembly having an upper and lower plate spaced apart by about 0.5 inch was employed, where the upper quartz baffle plate was configured with the cooling gas conduit in the manner shown in FIG. 7. As previously discussed, the cooling gas conduit serves to both cool the upper baffle plate in the baffle plate assembly and provide a counter-flow to the plasma impinging on the upper baffle plate from above to prevent excessive heating. Helium gas was used to cool the upper baffle and was introduced at flows ranging from 0 to 440 sccm.

Wafers were coated with about 8,200 angstroms of Shipley UV-6 photoresist, baked, and the thickness measured. The coated wafers were then processed in the Axcelis Technologies asher as in Example 1. Flow rates were 10,000 sccm of 4% hydrogen in helium and 100 µL/min (microliters per minute) of oxygen. The runs differed only in the amount of counter-flow cooling helium supplied to the baffle plate. The thickness loss (i.e., removal of photoresist) after plasma processing was then calculated. The thickness loss with no counter-flow cooling helium was 2,700 angstroms, this increased to 2,775 angstroms at 160 sccm counter-flow and 2,850 angstroms at 440 sccm of counter-flow. Clearly, the presence of the cooling gas counter-flow helped to increase the ash rate.

EXAMPLE 3

In this example, a comparison of two baffle plate designs were examined in the ES3Lk plasma asher commercially available from Axcelis Technologies, Inc. The plasma asher included a dual baffle plate assembly having an upper and lower plate separated by about 0.5 inch. In one comparative configuration, the upper baffle plate was constructed of quartz and was supported by 3 quartz legs resting on the lower baffle plate. The second configuration employed the use of a thermally conductive material. In this configuration as shown in FIG. 8, the upper baffle plate is formed of an aluminum plate suspended 0.5 inches from the lower baffle plate. Suspension is achieved by the use of mounting hardware formed of thermally conductive aluminum standoffs and appropriate connecting bolts to fixedly attach the upper baffle plate to the water-cooled lid of the plasma asher.

Wafers were coated with about 8,200 angstroms of Shipley UV-6 photoresist, baked and the thickness measured. The coated wafers were then processed in the plasma asher at 300° C., 30 seconds plasma-on, 1 torr pressure, and 1,200 W power using the two different baffle plate assemblies described above. Flow rates were 10,000 sccm of 4% hydrogen in helium and 100 µL/min (microliters per minute) of oxygen. Following processing, the thickness loss (i.e., removal of photoresist) after plasma processing with each baffle plate configuration was then calculated.

The runs differed in several respects. The first was the type of upper baffle plate (quartz or aluminum) and method of support (resting on lower baffle plate or suspended from water-cooled lid). The second was the immediate history of the asher machine—whether it had been sitting idle and was therefore "cold", or was in the middle of a batch of wafers and was therefore "warm". The tool history can be a factor t in terms of temperature management for the baffle plate assembly.

The results are shown in Table 1. Even though the average photoresist is higher for the quartz upper baffle, the difference between the cold and warm conditions is 850 angstroms for the quartz upper baffle and 450 angstroms for the aluminum upper baffle attached to the water-cooled chamber lid. This means that the aluminum upper baffle will contribute more favorably to wafer-to-wafer reproducibility, which is a very desirable feature and offers a significant commercial advantage.

TABLE 1

| BAFFLE PLATE TYPE | ASHER STARTING CONDITION | THICKNESS REMOVAL |
| --- | --- | --- |
| Quartz | Cold | 3,950 angstroms |
| Quartz | Warm | 3,100 angstroms |
| Aluminum | Cold | 3,200 angstroms |
| Aluminum | Warm | 2,750 angstroms |

Advantageously, the disclosed method of cooling the impingement portion of the baffle plate allows for the ashing rate to be maintained and/or increased compared to apparatus designs and ashing processes that do not employ a cooling step. Moreover, in various embodiments the throughput of the asher apparatus is not affected.

While the disclosure has been described with reference to an exemplary embodiment, it will be understood by those skilled in the art that various changes can be made and disclosure can be substituted for elements thereof without departing from the scope of the invention. In addition, many modifications can be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A plasma ashing process for removing photoresist material and post etch residues from a substrate including a low k dielectric material comprising carbon, hydrogen, or a combination of carbon and hydrogen, the process comprising:
   forming a plasma from an essentially oxygen free and nitrogen free gas mixture;
   flowing the plasma through an apertured baffle plate assembly and onto the substrate and removing photoresist material, post etch residues, and volatile byproducts from the substrate;
   flowing a cooling gas through an upper baffle plate of the apertured baffle plate assembly in a direction counter to the plasma flow and in an amount effective to reduce a temperature of the upper baffle plate.

2. The process of claim 1, wherein the apertured baffle plate assembly further comprises at least one additional baffle plate spaced apart from and coplanar to the upper baffle plate.

3. The process of claim 1, wherein the plasma comprises hydrogen and a noble gas.

4. The process of claim 3, wherein the noble gas is helium.

5. The process of claim 1, wherein flowing the cooling gas in the direction counter to the plasma flow is at a flow rate of 15 liters per minute to about 100 liters per minute at standard temperature and pressure conditions.

6. The process of claim 1, wherein flowing the cooling gas further comprises simultaneously heating the substrate.

7. The process of claim 1, wherein the cooling gas comprises an inert gas.

8. The process of claim 1, wherein the cooling gas is selected from the group consisting of helium, argon, hydrogen and mixtures thereof.

9. The process of claim 2, wherein the at least one additional baffle plate spaced apart from and coplanar to the upper baffle plate comprises a plurality of apertures disposed about a central axis increasing in density from the central axis to an outer edge of the at least one baffle plate.

10. The process of claim 2, wherein the upper baffle plate further comprises an impingement plate disposed in physical communication with a center portion of the upper baffle plate.

11. The process of claim 1, wherein the removing the photoresist material, the post etch residues, and the volatile byproducts from the substrate is at an ash rate greater than an ash rate in the absence of the cooling gas flow.

12. The process of claim 1, wherein the at least one additional baffle plate spaced apart from and coplanar to the upper baffle plate comprises a plurality of apertures disposed about a central axis increasing in diameter from the central axis to an outer edge of the at least one baffle plate.

13. A plasma ashing process for removing photoresist material and post etch residues from a substrate comprising carbon, hydrogen, or a combination of carbon and hydrogen, wherein the substrate comprises a low k dielectric layer, the process comprising:
   forming a plasma from an essentially oxygen free and nitrogen free gas mixture, wherein the plasma comprises hydrogen and helium;
   flowing the plasma into a process chamber, wherein the process chamber comprises an apertured baffle plate assembly in fluid communication with the plasma, wherein the apertured baffle plate assembly comprises a generally planar upper baffle plate fixedly positioned above a generally planar lower baffle plate, the lower baffle plate comprising a plurality of apertures disposed about a central axis, wherein the plurality of apertures increase in density from the central axis to an outer edge of the lower baffle plate;
   periodically cleaning the process chamber by introducing an oxygen plasma into the process chamber; and
   cooling the apertured baffle plate assembly by flowing a cooling gas at and about a central impingement region of the upper baffle plate.

14. The process of claim 13, wherein flowing the cooling gas over the apertured baffle plate assembly is at a flow rate of 15 liters per minute to 100 liters per minute at standard temperature conditions.

15. The process of claim 13, wherein flowing the cooling gas over the apertured baffle plate assembly is in a direction counter to the plasma flow.

16. The process of claim 13, wherein the cooling gas comprises an inert gas.

17. The process of claim 13, wherein the cooling gas is selected from the group consisting of helium, argon, hydrogen and mixtures thereof.

18. A process chamber adapted for receiving plasma, the process chamber comprising:

an apertured baffle plate assembly comprising a generally planar upper baffle plate positioned above a generally planar lower baffle plate, the lower baffle plate, the upper baffle plate comprising at least one thermally conductive standoff in thermal communication with a wall of the process chamber, wherein the apertured baffle plate assembly is disposed within the process chamber.

19. The process chamber of claim 18, wherein the wall of the process chamber is water-cooled.

20. The process chamber of claim 18, wherein the upper baffle plate is formed of a thermally conductive material.

21. The process chamber of claim 18, wherein the upper baffle plate is formed of aluminum.

22. A downstream plasma asher comprising the process chamber of claim 18.

* * * * *